(12) United States Patent
Shi et al.

(10) Patent No.: US 10,658,550 B2
(45) Date of Patent: May 19, 2020

(54) ULTRAVIOLET LIGHT EMITTING DIODE AND MANUFACTURING METHOD THEREOF

(71) Applicant: XIAMEN SAN'AN OPTOELECTRONICS CO., LTD., Xiamen (CN)

(72) Inventors: Junpeng Shi, Xiamen (CN); Qiuxia Lin, Xiamen (CN); Zhenduan Lin, Xiamen (CN); Chen-Ke Hsu, Xiamen (CN); Chih-Wei Chao, Xiamen (CN)

(73) Assignee: XIAMEN SAN'AN OPTOELECTRONICS CO., LTD., Xiamen (CN)

(*) Notice: Subject to any disclaimer, the term of this patent is extended or adjusted under 35 U.S.C. 154(b) by 0 days.

(21) Appl. No.: 16/186,511

(22) Filed: Nov. 10, 2018

(65) Prior Publication Data

US 2019/0081216 A1 Mar. 14, 2019

Related U.S. Application Data

(63) Continuation of application No. PCT/CN2017/085657, filed on May 24, 2017.

(30) Foreign Application Priority Data

May 27, 2016 (CN) .......................... 2016 1 0360174

(51) Int. Cl.
*H01L 33/48* (2010.01)
*H01L 33/60* (2010.01)
H01L 33/58 (2010.01)
H01L 33/62 (2010.01)
H01L 33/44 (2010.01)

(52) U.S. Cl.
CPC .......... *H01L 33/483* (2013.01); *H01L 33/486* (2013.01); *H01L 33/60* (2013.01); H01L 33/44 (2013.01); H01L 33/58 (2013.01); H01L 33/62 (2013.01); H01L 2924/16195 (2013.01);
(Continued)

(58) Field of Classification Search
CPC ........................... H01L 33/483; H01L 33/486
See application file for complete search history.

(56) References Cited

U.S. PATENT DOCUMENTS

2012/0267671 A1* 10/2012 Jung .................... H01L 33/486
257/99
2013/0234274 A1 9/2013 Kam et al.
(Continued)

FOREIGN PATENT DOCUMENTS

JP 2007-317815 A 12/2007

OTHER PUBLICATIONS

English language translation of JP 2007/317815's detailed description (Year: 2007).*

*Primary Examiner* — Grant S Withers
(74) *Attorney, Agent, or Firm* — Syncoda LLC; Feng Ma

(57) ABSTRACT

A light-emitting diode (LED) package structure includes: a support; an LED chip; and a package cover, wherein: a support circuit is formed over the support; the LED chip is arranged over the support and electrically coupled to the support circuit; a lower surface periphery of the package cover is provided with a groove structure filled with organic binder; and the package cover is arranged over the LED chip and connected to the support via the organic binder.

16 Claims, 5 Drawing Sheets

(52) U.S. Cl.
CPC ............... *H01L 2933/0033* (2013.01); *H01L 2933/0058* (2013.01)

(56) References Cited

U.S. PATENT DOCUMENTS

2017/0112952 A1* 4/2017 Kato .................... A61L 2/10
2018/0212115 A1* 7/2018 Huang ................ H01L 33/56

* cited by examiner

ULTRAVIOLET LIGHT EMITTING DIODE AND MANUFACTURING METHOD THEREOF

CROSS-REFERENCE TO RELATED APPLICATIONS

The present application is a continuation of, and claims priority to, PCT/CN2017/085657 filed on May 24, 2017, which claims priority to Chinese Patent Application No. 201610360174.8 filed on May 27, 2016. The disclosures of these applications are hereby incorporated by reference in their entirety.

BACKGROUND

A light emitting diode (LED) is a solid semiconductor light emitting device. With the advancement of LED technology, the LED package is developing towards near-ultraviolet range and even deep-ultraviolet range as well as high power. However, in a typical conventional package, the LED chip surface is coated with a layer of high-refractivity organic package adhesive, which is prone to failure after long-term service due to such factors as water, light and heat. This leads to sharp depreciation of device luminous flux and radiant flux, and even causes device failure. For high-power LED integrated light sources, a variety of factors like chip heating and insufficient heat dissipation may result in high surface temperature and device failure.

Currently, most UVLEDs are in the range of UVA and UVB. Typically, UVA covers the range of 320-400 nm, and is also known as long-wavelength black-light ultraviolet. With strong penetration, UVA can penetrate deeply into most glass and plastic; while UVB covers the range of 275-320 nm, and is also referred to as middle-wavelength red-light ultraviolet. UVB exhibits medium penetration, and its short-wavelength part can be absorbed by transparent glass.

SUMMARY

The inventors of the present disclosure have recognized that, the package method of UVLED depends on the characteristics of different ultraviolet bands. For example, for UVA above 385 nm, organic silicon is often used. For UVB and UVC below 385 nm, groups like phenyl groups in the organic package adhesive may be damaged due to high energy, resulting in poor reliability after long-term service. To extend the service life of low-band UVLED, some manufacturers replace the organic package silica gel with inorganic materials like glass, which gives rise to another problem: bonding between the substrate and glass. In addition, if AuSn eutectic package is adopted, new machine and process are required for plating metals on glass and the substrate. Moreover, this contact may cause mismatch in coefficient of thermal expansion (CTE).

To overcome the problems in existing technologies, various embodiments of the present disclosure provide an ultraviolet light emitting diode package structure and manufacturing method thereof, which extends service life and improves reliability of the package device.

In an aspect, a light emitting diode package structure is provided, including: a support, a LED chip and a package cover, wherein a circuit is formed on the support, and the LED chip is arranged on the support and electrically connected to the support circuit, wherein: the lower surface periphery of the package cover is provided with a groove structure, which is filled with organic binder; and the package cover is arranged on the LED chip and is connected to the support via organic binder.

In some embodiments, the groove structure has at least one circle.

In some embodiments, the groove structure appears closed or non-closed form.

In some embodiments, the groove structure surface is provided with a reflective layer or an absorption layer.

In some embodiments, the reflective layer is a metal reflective layer or a non-metal reflective layer.

In some embodiments, the package cover is a lens or a cover.

In some embodiments, the support has a cup surrounding the LED chip, and the groove structure is at the cup top.

In some embodiments, the organic binder is formed between the cup top and the package cover.

In some embodiments, the support is a ceramic support or a plastic support.

In another aspect, a method of manufacturing a light emitting diode package structure is provided, including: (1) providing a support and forming a circuit on the support; (2) providing a LED chip, which is arranged on the support and electrically connected to the support circuit; (3) providing a lens or a cover, and arranging a groove structure around the lower surface periphery of the lens, and filling the groove structure with organic binder; and (4) arranging the lens or the cover on the LED chip, and bonding the lens or the cover with the support via organic binder.

In some embodiments, deposit a reflective layer or an absorption layer over the groove structure surface before filling the groove structure with organic binder in step (3).

In some embodiments, the groove structure in step (3) has at least one circle.

In some embodiments, the groove structure in step (3) appears closed or non-closed form.

In some embodiments, the support has a cup surrounding the LED chip, and the groove structure is at the cup top.

In some embodiments, the organic binder is formed between the cup top and the package cover.

In some embodiments, the support is a ceramic support or a plastic support.

Compared with the existing technologies, the ultraviolet light emitting diode package structure and manufacturing method thereof according to some embodiments the present disclosure can have one or more of the following adantages: (1) the package cover of UVLED package structure is provided with the groove structure, which is filled with an organic binder layer. This prevents the organic binder layer or the plastic support from being emitted by ultraviolet light (such as UVC), thus extending service life and making the package device more reliable; (2) the organic binder layer can serve as a buffer layer for stress release due to small Young modulus, which resolves mismatch in coefficient of thermal expansion.

The other features and advantages of this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
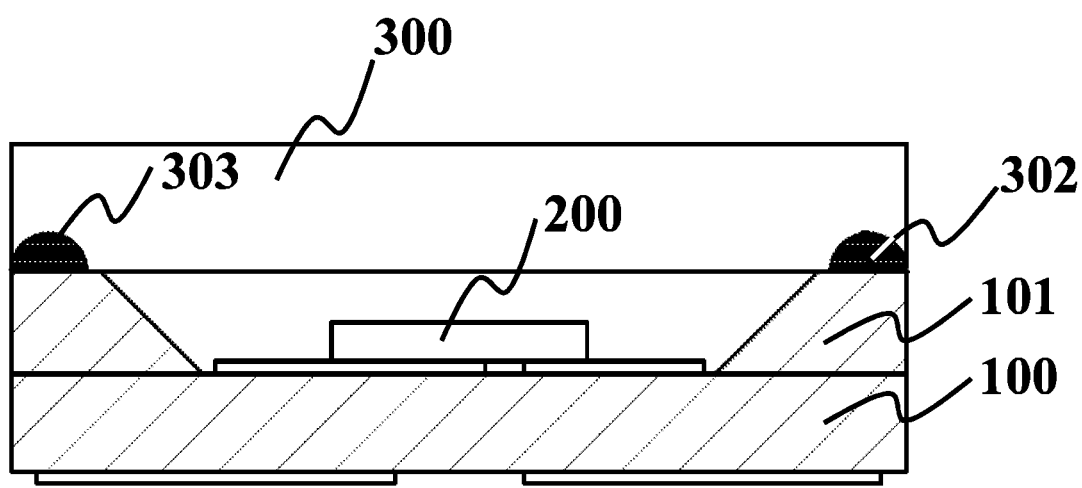
FIG. 1 is a schematic view of the ultraviolet LED package structure according to Embodiment 1.

In the drawings: 100: support; 101: cup; 200: LED chip; 300: package cover; 301: groove structure; 302: organic binder; 303: reflective layer/absorption layer.

DETAILED DESCRIPTION

The fabrication method of the ultraviolet LED package structure will be explained in details with reference to the accompanying drawings. Before further description, it should be understood, however, that various modifications and changes may be made to these embodiments. Therefore, the present disclosure is not limited to the embodiments below. It should also be noted that the scope of the present disclosure should still be subjected to the scope defined in the claims and the embodiments are merely for purposes of illustration, rather than restricting. Unless otherwise specified, all technical and scientific words shall have the same meanings as understood by persons skilled in the art.

Embodiment 1

Figure 2:
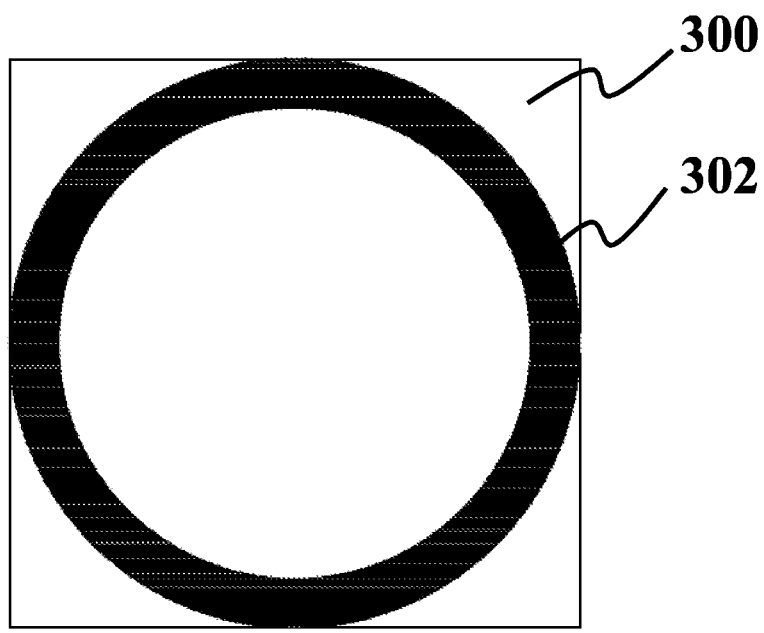
FIG. 2 is a schematic view of the lens having a groove structure as shown in FIG. 1 (filled with organic binder).
Figure 3:
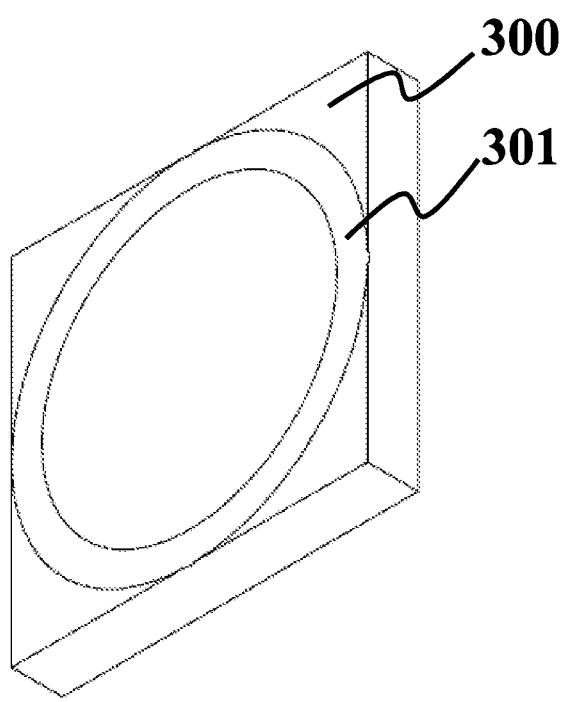
FIG. 3 is a schematic view of the lens having a groove structure as shown in FIG. 1 (not filled with organic binder).

As shown in FIGS. 1-3, this embodiment provides an ultraviolet light emitting diode package structure, comprising: a support 100, a flip-chip LED chip 200 and a package cover 300, wherein a circuit is formed on the support 100, and the LED chip 200 is arranged on the support 100 and electrically connected to the support circuit, wherein, the lower surface periphery of the package cover 300 is provided with a circular groove structure 301, the inner surface of the which is provided with a reflective layer 303, and the groove structure 301 is filled with organic binder 302; the package cover 300 is arranged on the LED chip 200, and is connected to the support 100 via the organic binder 302.

The material of the support 100 can be ceramic or plastic. In this embodiment, a ceramic support is preferred. The support is preferred to have a cup 101 surrounding the LED chip 200. The groove structure 301 is located at top of the cup 101, and the organic binder 302 is between the top of the cup 101 and the package cover 300.

The package cover 300 can be a lens or a cover. In this embodiment, the package cover is a quartz lens.

Depending on the service environment of ultraviolet LED package device, the groove structure 301 can have one circle or a plurality of circles, and can appear closed circle or non-closed circle form. If the LED device is used in poor environments such as in water or air or sulfur abundant environment, the groove structure is preferred to be a closed circle, and is filled with an organic binder layer (epoxy resin or silicone), which facilitates the package sealing between the lens and the support. Or, the groove structure can have a plurality of circles to avoid poor binding at a certain place resulted from a single circle, and improves reliability; if the LED device is used in a high temperature environment, the groove structure is preferred to be a non-closed having an opening in some part, which facilitates heat dissipation of the package structure via air circulation.

Because the surface of the package cover 300 is generally smoother than the surface of the support 100, for example, a surface of a quartz glass is smoother than a surface of a ceramic, the adhesion of the organic binder 302 to the package cover 300 is generally poor. In this embodiment, the groove structure 301 is provided on the lower surface of the package cover, so that the contact area of the organic binder 302 and the package cover 300 can be increased, which is advantageous for improving adhesion.

The groove structure inner surface is provided with a reflective layer or an absorption layer, which can be formed by plating process such as electroplating or vapor deposition. The reflective layer can be an Ag or Al metal reflective layer, or a non-metal reflective layer, such as a distributed Bragg reflective layer (DBR). The absorption layer material can be metal or electric medium. Thanks to high transmittance of the quartz lens package cover 300, UV light is likely to be emitted on the organic binder 302 through the lens. The reflective layer/absorption layer 303 is arranged on the groove structure 301, which avoids the organic adhesive aging as a result of being emitted by UV light, making the ultraviolet LED device much more reliable.

The ultraviolet light emitting diode package structure according to the present embodiment can be fabricated following the steps below:

(1) providing a support 100 having a cup 101, and forming a circuit on the support;

(2) arranging a flip-chip LED chip 200 on the support, which is electrically connected to the support circuit;

(3) providing a quartz lens as the package cover 300, and arranging a groove structure 301 on the lower surface periphery of the quartz lens; depositing a reflective layer/an absorption layer 303 over the inner surface of the groove structure 301, and filling the groove structure 301 with organic binder 302; and (4) arranging the package cover 300 on the LED chip 200, and connecting the package cover to the support 100 via organic binder 302.

In the present disclosure, the package cover of UVLED package structure is provided with a groove structure, which is filled with an organic binder layer. This prevents the organic binder layer or the plastic support from being emitted by ultraviolet light (such as UVC), thus extending service life and making the package device more reliable. However, due to different coefficient of thermal expansion, for example, the coefficient of thermal expansion of the quartz glass is 0.5 ppm/K and that of the ceramic support is 6 ppm/K, the cover may be fractured subject to tensile stress when temperature is high during service life of the device. The organic binder layer material can serve as a buffer layer for stress release thanks to small Young modulus, which resolves the mismatch in coefficient of thermal expansion.

Embodiment 2

Figure 4:
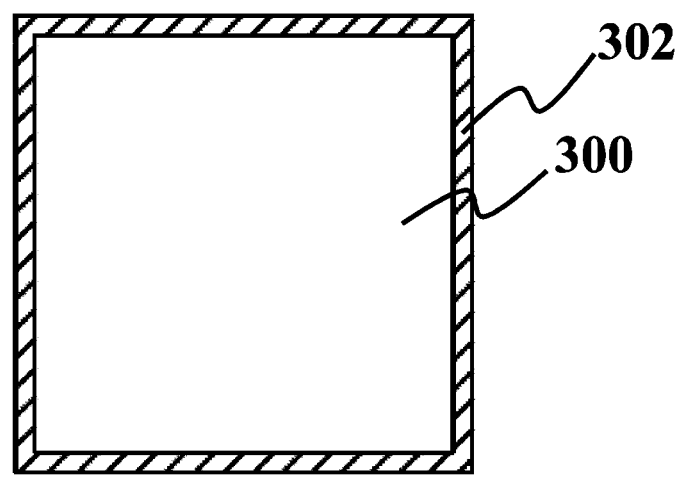
FIG. 4 is a schematic view of the cover of the ultraviolet LED package structure having a groove structure according to Embodiment 2 (filled with organic binder).
Figure 5:
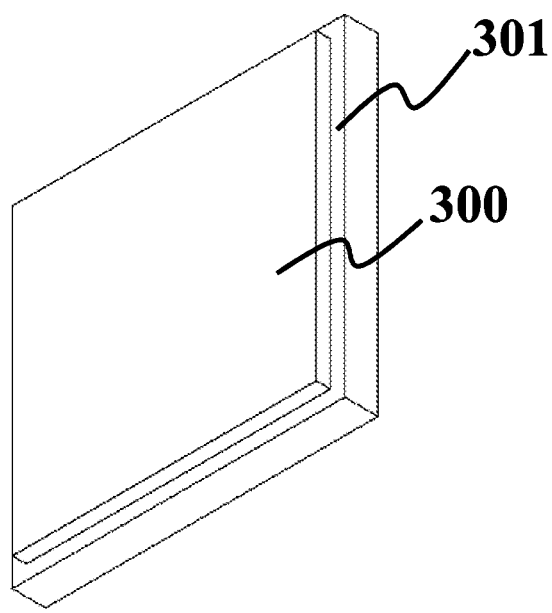
FIG. 5 is a schematic view of the cover of the ultraviolet LED package structure having a groove structure according to Embodiment 2 (not filled with organic binder).

As shown in FIGS. 4 and 5, the difference between this embodiment and Embodiment 1 is that: The package cover 300 in Embodiment 1 is a quartz lens, and the package cover 300 of this embodiment is a glass cover; and the groove structure 301 in Embodiment 1 appears circular, and the groove structure 301 in this embodiment appears rectangle and is at the outer edge of the glass cover. The design advantages of this structure are that: the groove structure is far from the ultraviolet LED light source as much as possible, thus avoiding organic binder aging from UV emitting, which may influence device reliability.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode (LED) package structure comprising:
    a support;
    an LED chip; and
    a package cover,
    wherein:
    a support circuit is formed over the support;
    the LED chip is arranged over the support and electrically coupled to the support circuit;
    a lower surface periphery of the package cover is provided with a groove structure entirely filled with organic binder;
    the package cover is arranged over the LED chip and connected to the support via the organic binder; and
    wherein the groove structure does not extend entirely through the package cover.

2. The LED package structure of claim 1, wherein the groove structure comprises at least one circular groove.

3. The LED package structure of claim 2, wherein the at least one circular groove is a closed circular groove.

4. The LED package structure of claim 2, wherein the at least one circular groove is a non-closed circular groove.

5. The LED package structure of claim 2, wherein the groove structure comprises a plurality of concentric circular grooves.

6. The LED package structure of claim 1, wherein the groove structure surface is provided with a reflective layer or an absorption layer.

7. The LED package structure of claim 1, wherein the groove structure is as far as possible away from the LED chip.

8. The LED package structure of claim 1, wherein the groove structure is at the outer edge of the package cover.

9. The LED package structure of claim 1, wherein the package cover is a lens or a plate cover.

10. The LED package structure of claim 1, wherein the support has a cup surrounding the LED chip, and the groove structure is at at a top of the cup.

11. The LED package structure of claim 1, wherein the support is a ceramic support or a plastic support.

12. A light-emitting system comprising a plurality of light-emitting diode (LED) package structures each including:
    a support;
    an LED chip; and
    a package cover,
    wherein:
    a support circuit is formed over the support;
    the LED chip is arranged over the support and electrically coupled to the support circuit;
    a lower surface periphery of the package cover is provided with a groove structure entirely filled with organic binder;
    the package cover is arranged over the LED chip and connected to the support via the organic binder;
    wherein the groove structure does not extend entirely through the package cover.

13. The system of claim 12, wherein the groove structure is as far as possible away from the LED chip.

14. The system of claim 12, wherein the groove structure is at the outer edge of the package cover.

15. The system of claim 12, wherein the package cover is a lens.

16. The system of claim 15, wherein the support has a cup structure surrounding the LED chip, and the groove structure is at a top of the cup structure.

* * * * *